United States Patent [19]

Maeda et al.

[11] Patent Number: 4,985,680

[45] Date of Patent: Jan. 15, 1991

[54] RF COIL SYSTEM IN MAGNETIC RESONANCE IMAGING APPARATUS

[75] Inventors: Tomohisa Maeda; Kazuhiko Tsujita, both of Nishinasunomachi, Japan

[73] Assignee: Kabushiki Kaisha Toshiba, Kawasaki, Japan

[21] Appl. No.: 353,273

[22] Filed: May 17, 1989

[30] Foreign Application Priority Data

May 20, 1988 [JP] Japan .................................. 63-124494

[51] Int. Cl.$^5$ ............................................ G01R 33/20
[52] U.S. Cl. ..................................... 324/322; 324/318
[58] Field of Search ............... 324/300, 307, 309, 318, 324/319, 320, 322

[56] References Cited

U.S. PATENT DOCUMENTS

| | | | |
|---|---|---|---|
| 4,129,822 | 12/1978 | Traficante | 324/322 |
| 4,638,252 | 1/1987 | Bradshaw | 324/300 |
| 4,712,560 | 12/1987 | Schaefer | 324/309 |
| 4,717,881 | 1/1988 | Flugan | 324/322 |
| 4,725,779 | 2/1988 | Hyde et al. | 324/318 |
| 4,737,712 | 4/1988 | Stormont | 324/322 |
| 4,763,076 | 8/1988 | Arakawa | 324/322 |

Primary Examiner—Michael J. Tokar
Attorney, Agent, or Firm—Finnegan, Henderson, Farabow, Garrett and Dunner

[57] ABSTRACT

An RF coil system having $(2n+1)/4$ (n: zero or a positive integer) wavelength cables arranged in both ends of a PIN diode conneted in series with an RF coil, and a PIN diode is DC-biased via the aforementioned cable. A multi-band RF system constructed by providing a plurality of such wavelength cables corresponding to the frequencies of an RF pulse in obtaining an MR signal. Since the cable is, for example, of a coaxial type, the length of the cable is easy to adjust and it is thus possible to avoid coupling to the ambient environment.

7 Claims, 2 Drawing Sheets

RF COIL SYSTEM IN MAGNETIC RESONANCE IMAGING APPARATUS

BACKGROUND OF THE INVENTION

1. Field of the Invention

The present invention relates to an RF coil system in magnetic resonance imaging apparatus.

2. Description of the Related Art

In an MR (magnetic resonance) phenomenon, atomic nuclei having a magnetic moment are placed in a static magnetic field where they absorb and emit an electromagnetic wave of a specified frequency through resonance and the resonance frequency (Lamor frequency) $\nu o$ of the atomic nuclei can be expressed as follows:

$$\nu o = \gamma Ho/2 \tag{1}$$

where $\gamma$: a magnetogyric ratio inherent in types of atomic nuclei; and

Ho: the intensity of the static magnetic field.

An MRI system for diagnosing an inner state of a subject through the utilization of the MR phenomenon detects an electromagnetic wave generated within the subject and processes the electromagnetic wave as an MR signal. By so doing, it is possible to noninvasively obtain a slice image of the subject representing the density of the atomic nuclei, longitudinal relaxation time T1, transverse relaxation time T2, a flow and chemical shift.

A PIN diode which is controlled by a bias control circuit is connected in series with an RF (radio frequency) coil system for MRI apparatus. If an RF pulse is transmitted to the subject with the use of the RF coil system, the PIN diode is turned ON by a DC bias (forward-bias) of the bias control circuit. If an MR signal is to be detected by another receive-only coil, the PIN diode is turned OFF by a reverse bias, thereby preventing the RF coil from coupling to the receive-only coil.

Even if the PIN diode is turned OFF, a high frequency current will flow into the bias control circuit due to the connection of the bias control circuit to the RF coil. In order to prevent such occurrence, as shown in FIG. 1, an RF coil system is provided in which parallel resonance circuits 3 and 4 are connected to the anode and cathode of the PIN diode 2 in series with an RF coil 1 such that the RF coil 1 is connected via the resonance circuits 3 and 4 to a bias control circuit 5. Values of elements in the parallel resonance circuits 3 and 4 are set to resonate with the high frequency current flowing through the RF coil 1. Since, in this case, an impedance at a resonance becomes maximum in the resonance circuit, the flow of a high frequency current through the bias control circuit 5 is prevented. Furthermore, as a DC impedance of the parallel resonance circuits 3 and 4 is approximately zero, there is almost no problem in a DC bias (forward and reverse biases) of the PIN diode 2.

However, the use of the LC parallel resonance circuits, encounters a difficulty in adjusting the resonance frequency. A coupling also occurs to a variation in the surrounding environment.

Therefore, there is a growing demand for an apparatus which can prevent occurrence of coupling in surrounding environment without using an LC resonance circuit.

SUMMARY OF THE INVENTION

It is accordingly the object of the present invention to provide an RF coil system in a magnetic resonance imaging system.

According to one aspect of the present invention, an RF coil system comprises an RF coil means for generating RF magnetic fields, and detecting magnetic resonance signals from a subject; diode means having an anode and a cathode for providing a direct current bias, the diode means being series-connected to the RF coil means; control means, having first and second terminals, for controlling on/off operation of the diode means; first cable means for stopping an induced current from the RF coil means, including an open end and a short-circuited end each having center and outer terminals, one terminal of the of the open end of the first cable means being coupled to the anode, the other terminal of the open end of the first cable means being coupled to the first terminal of the control means, one terminal of the short-circuited end of the first cable means being connected to the other terminal of the short-circuited end of the first cable means and; and second cable means for stopping an induced current from the RF coil means, including an open end and a short-circuited end each having center and outer terminals, one terminal of the of the open end of the second cable means being coupled to the cathode, the other terminal of the open end of the second cable means being coupled to the second terminal of the control means, one terminal of the short-circuited end of the second cable means being connected to the other terminal of the short-circuited end of the second cable means.

According to a supplemental aspect of the present invention, the RF coil system also includes third cable means, including an open end and a short-circuited end each having center and outer terminals, one terminal of the short-circuited end of the third cable means being connected to the other terminal of the short-circuited end of the third cable means; forth cable means, including an open end and a short-circuited end each having center and outer terminals, one terminal of the short-circuited end of the forth cable means being connected to the other terminal of the short-circuited end of the forth cable means, wherein the other terminal of the open end of the first cable means is coupled to the first terminal of the control means by a series connection through the center and outer terminals of the open end of the third cable means, and the other terminal of the open end of the second cable means is coupled to the second terminal of the control means by a series connection through the center and outer terminals of the open end of the forth cable means.

DETAILED DESCRIPTION OF THE PREFERRED EMBODIMENTS

The embodiments of the present invention will be explained below by referring to the accompanying drawings.

Figure 2:
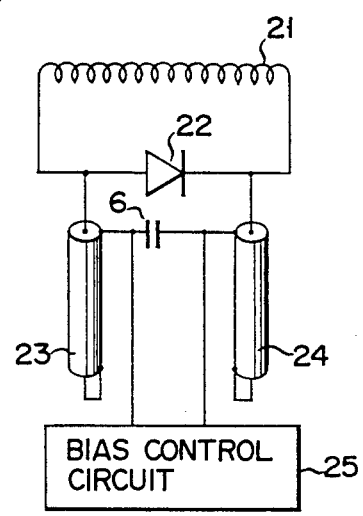
FIG. 2 is a circuit diagram showing an arrangement of an RF coil system according to a first embodiment of the present invention.

In an RF coil system shown in FIG. 2, quarter-wavelength cables (also called λ/4 cables) 23 and 24 are connected to a diode, that is, to the anode and cathode of a PIN diode 22 which is connected in series with an RF coil 21. The PIN diode 22 is DC-biased via the quarter-wavelength cables 23 and 24. The quarter-wavelength cables 23 and 24 are formed by cutting a coaxial cable to a length of a quarter-wavelength of an RF induced current to be blocked and short-circuiting center and outer conductors at one end of the cable. The center conductor at an "open end" side of the cable is connected to the cathode or the anode of the PIN diode 22 and the outer conductor at the "open end" side of the cable is connected to a coupling capacitor 6. Output terminals of a bias control circuit 25 is connected to both terminals of the capacitor 6.

In general, if one end of the coaxial cable having a length l is short-circuited and characteristic impedance is Zo, the "open-end" impedance Z is given below:

$$Z = jZo \tan(2\pi l/\lambda) = j Zo \tan(2\pi fl/c) \quad (2)$$

where
- λ: the wavelength
- f: the frequency
- c: the velocity of current flowing through the cable.

When l=λ/4, Z→∞, that is, the impedance z becomes a high level. In actual practice, however, Z→∞ is not obtained due to a loss of the cable.

The impedance viewed from the RF coil 21 toward the bias control circuit 25 in FIG. 2 becomes very high by selecting the cable length l corresponding to λ/4 which is determined by the frequency of an RF pulse used in obtaining an MR signal. The impedance of the quarter-wave length cable becomes substantially zero in direct current.

In the aforementioned arrangement, DC-biased (forward-biased) current from the bias control circuit 25 is supplied via the quarter-wavelength cables 23 and 24 to the PIN diode 22, thus turning the PIN diode 22 ON.

If, on the other hand, a reverse bias is applied to the PIN diode 22, the PIN diode is turned OFF. Since, in this case, the quarter-wavelength cables 23 and 24 have a high impedance with respect to high-frequency current, it is possible to prevent a flow of electric current from the RF coil 21 into the bias control circuit 25.

As set forth above, according to the present RF coil system, a flow of the high-frequency current into the bias control circuit 25 can be prevented due to the presence of the quarter-wavelength cables 23 and 24. Furthermore, the present system removes the need for using a LC parallel resonance circuit and the cable length is easy to adjust because the quarter-wavelength cable is made of, for example, coaxial cable. The present cable is not affected by the surrounding environment and can avoid occurrence of a coupling to the surrounding environment because the quarter-wavelength cable is of a coaxial type.

Another embodiment will be explained below.

Although, in the aforementioned embodiment, an explanation has been given about the RF coil system having one type of quarter-wavelength cable, a multiband RF coil system may be employed according to the present invention. That is, a plurality of kinds of quarter-wavelength cables are connected in a series array in accordance with the frequencies of an RF pulse as used in obtaining an MR signal.

Figure 3:
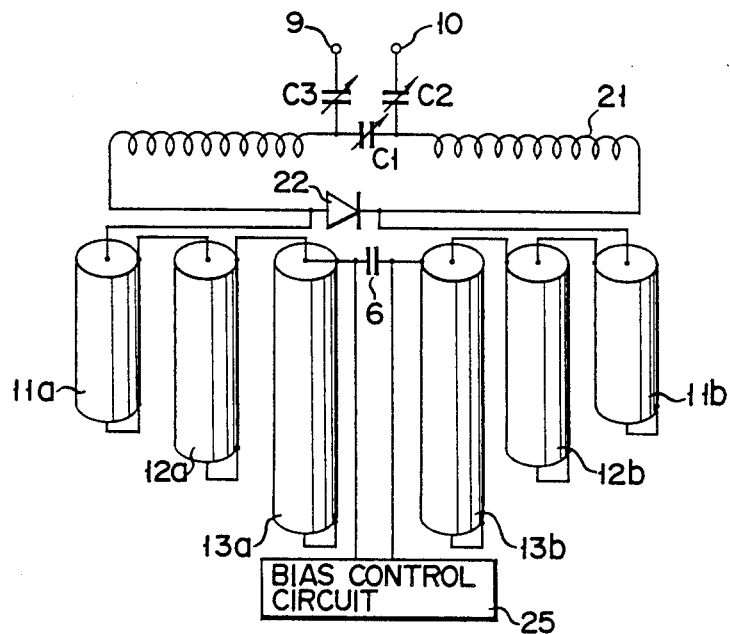
FIG. 3 is a circuit diagram showing an arrangement of an RF coil system according to a second embodiment of the present invention.

If, in FIG. 3, the frequencies of the RF pulse are f1, f2 and f3 (f1>f2>f3), quarter-wavelength cables 11a and 11b correspond to f1, quarter-wavelength cables 12a and 12b correspond to f2 and quarter-wavelength cables 13a and 13b correspond to f3. The cables 11a, 12a and 13a, as well as cables 11b, 12b and 13b, are connected in a series array, respectively. Capacitors C1, C2 and C3 are provided in an RF coil 21 and used for a tuning. Current supply points 9 and 10 corresponding to one end of the capacitor C2 and one end of the capacitor C3 are provided to generate an RF magnetic field.

In the arrangement shown in FIG. 3, the impedance Zp of the quarter-wavelength cables viewed from both ends of a PIN diode 22 is given below:

$$\begin{aligned} Z_p &= j\, Zo\, \{2\tan(2\pi f \cdot l1/c) + \\ &\quad 2\tan(2\pi f \cdot l2/c) + \\ &\quad 2\tan(2\pi f \cdot l3/c)\} + 1/j\omega Co \\ &= 2j\, Zo\, \{\tan(2\pi f \cdot l1/c) + \\ &\quad \tan(2\pi f \cdot l2/c) + \tan(2\pi f \cdot l3/c)\} \end{aligned} \quad (3)$$

Here, Co denotes a capacitance of a coupling capacitor 6, which has a great value compared with the impedance of each cable.

Since, as set forth above, the impedance Zp has a very high value for the frequencies f1, f2 and f3, the quarter-wavelength cable, constitute no load for the RF coil 21. Since the impedance of the quarter-wavelength cable is substantially zero in direct current, no problem arises from the DC-biasing of the PIN diode 22, as in the case of the aforementioned embodiment.

In the system shown in FIG. 2, for example, it is necessary to exchange the quarter-wavelength cables 23 and 24 each time the frequency of the RF pulse is switched in obtaining an MR signal. However, the system of FIG. 3 eliminates the necessity of exchanging the quarter-wavelength cables.

Figure 1:
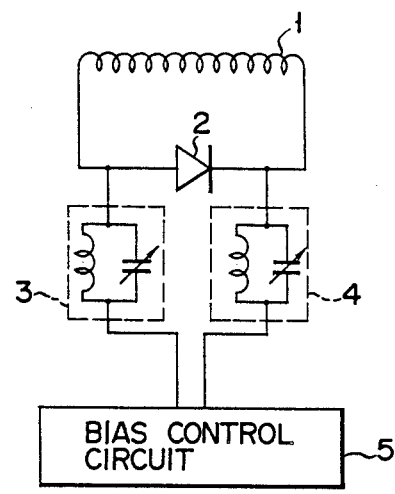
FIG. 1 is a circuit diagram showing an arrangement of a conventional RF coil system.
Figure 4:
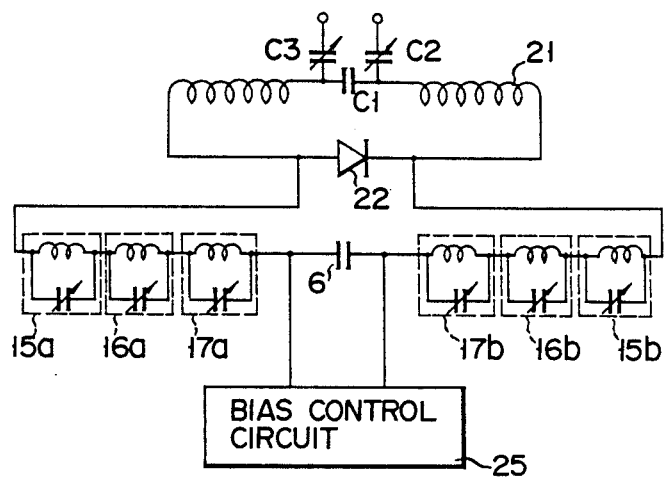
FIG. 4 is a circuit diagram showing an arrangement of an RF coil system according to a third embodiment of the present invention.

As still another embodiment, an RF coil system having a series array of parallel resonance circuits 15a, 16a and 17a and that of parallel resonance circuits 15b, 16b and 17b as shown in FIG. 4, is used in place of the system of FIG. 3. Since, however, the LC parallel resonance circuit is needed, the resonance frequency, etc., are difficult to adjust as in the case of the arrangement shown in FIG. 1.

Although the present invention has been explained in connection with the aforementioned embodiments, it is not restricted to the aforementioned embodiments. Various changes and modifications of the present invention can be made within the spirit and scope of the present invention.

Although, in the aforementioned embodiment, explanation has been made in connection with the RF coil system having the quarter-wavelength cable, the same advantage can be obtained by using an RF coil system having a (2n+1)/4 (n: zero or a positive integer) wavelength cable, such as a ¾ wavelength cable, 5/4 wavelength cable, ..., in place of the quarter-wavelength cable.

What is claimed is:
1. An RF coil system comprising:

RF coil means for generating RF magnetic fields, and detecting magnetic resonance signals from a subject;

diode means having an anode and a cathode for providing a direct current bias, the diode means being series-connected to the RF coil means;

control means, having first and second terminals, for controlling on/off operation of the diode means;

first cable means for stopping an induced current from the RF coil means, including an open end and a short-circuited end each having center and outer terminals, one terminal open end of the first cable means being coupled to the anode, the other terminal of the open end of the first cable means being coupled to the first terminal of the control means, one terminal of the short-circuited end of the first cable means being connected to the other terminal of the short-circuited end of the first cable means and; and second cable means for stopping an induced current from the RF coil means, including an open end and a short-circuited end each having center and outer terminals, one terminal of the open end of the second cable means being coupled to the cathode, the other terminal of the open end of the second cable means being coupled to the second terminal of the control means, one terminal of the short-circuited end of the second cable means being connected to the other terminal of the short-circuited end of the second cable means.

2. The system according to claim 1, wherein the first and second cable means have length of $(2n+1)/4$ (n is a zero, or a positive integer) times the wavelength of an RF induced current to be stopped.

3. The system according to claim 2, wherein one of the $(2n+1)/4$ cable means includes a coaxial cable.

4. The RF coil system of claim 1 and further including third cable means, including an open end and a short-circuited end each having center and outer terminals, one terminal of the short-circuited end of the third cable means being connected to the other terminal of the short-circuited end of the third cable means;

forth cable means, including an open end and a short-circuited end each having center and outer terminals, one terminal of the short-circuited end of the forth cable means being connected to the other terminal of the short-circuited end of the forth cable means, wherein the other terminal of the open end of the first cable means is coupled to the first terminal of the control means by a series connection through the center and outer terminals of the open end of the third cable means, and the other terminal of the open end of the second cable means is coupled to the second terminal of the control means by a series connection through the center and outer terminals of the open end of the forth cable means.

5. The system according to claim 4, where the first and second cable means have length of $(2n+1)/4$ (n is a zero, or a positive integer) times the wavelength of an RF induced current to be stopped, and the third and forth cable means have length of $(2m+1)/4$ (m is a zero, or a positive integer) times the wavelength of an RF induced current to be stopped, and n is not equal to m.

6. The system according to claim 5, wherein one of the $(2n+1)/4$ cable means include a coaxial cable.

7. A system according to claim 5, wherein one of the $(2m+1)/4$ wavelength cables includes a coaxial cable.

* * * * *

UNITED STATES PATENT AND TRADEMARK OFFICE
CERTIFICATE OF CORRECTION

PATENT NO. : 4,985,680
DATED     : January 15, 1991
INVENTOR(S) : Tomohisa Maeda et al It is certified that error appears in the above-identified patent and that said Letters Patent is hereby corrected as shown below:

Title Page:

Abstract, line 3, change "connected" to --connected--.
Abstract, line 4, after "diode" delete [is].
Abstract, line 5, after "system" insert --is--.
Claim 1, column 5, line 13, before "open" insert --of the--.
Claim 1, column 5, line 21, change "and; and" to --; and--.
Claim 4, column 6, line 11, change "forth" to --fourth--.
Claim 4, column 6, line 14, change "foth" to --fourth--
Claim 4, column 6, line 15, change "forth" to --fourth--.
Claim 4, column 6, line 25, change "forth" to --fourth--.
Claim 5, column 6, line 30, change "forth" to --fourth--.
Claim 6, column 6, line 34, change "include" to --includes--.
Claim 7, column 6, line 36, change "wavelength cables" to --cable means--.

Signed and Sealed this

Fourth Day of May, 1993

Attest:

MICHAEL K. KIRK

*Attesting Officer*     *Acting Commissioner of Patents and Trademarks*